(12) United States Patent
Sawano et al.

(10) Patent No.: US 11,881,705 B2
(45) Date of Patent: Jan. 23, 2024

(54) POWER DISTRIBUTION DEVICE, POWER DISTRIBUTION METHOD, AND COMPUTER PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shunichi Sawano, Yokkaichi (JP); Masayuki Kato, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 466 days.

(21) Appl. No.: 17/281,416

(22) PCT Filed: Sep. 30, 2019

(86) PCT No.: PCT/JP2019/038547
§ 371 (c)(1),
(2) Date: Mar. 30, 2021

(87) PCT Pub. No.: WO2020/080079
PCT Pub. Date: Apr. 23, 2020

(65) Prior Publication Data
US 2022/0045502 A1 Feb. 10, 2022

(30) Foreign Application Priority Data
Oct. 18, 2018 (JP) .................................. 2018-196859

(51) Int. Cl.
*H02H 5/04* (2006.01)
*G01R 19/165* (2006.01)
(Continued)

(52) U.S. Cl.
CPC ......... *H02H 5/04* (2013.01); *G01R 19/16538* (2013.01); *H01H 85/08* (2013.01); *H02H 3/085* (2013.01); *H03K 17/687* (2013.01)

(58) Field of Classification Search
CPC ................................. H02H 5/04; H02H 3/085
See application file for complete search history.

(56) References Cited

U.S. PATENT DOCUMENTS

2012/0081825 A1 4/2012 Nakamura et al.
2013/0253722 A1 9/2013 Nakamura et al.
(Continued)

FOREIGN PATENT DOCUMENTS

| JP | 2003-220908 A | 8/2003 |
| JP | 2015-057017 A | 3/2015 |
| JP | 2016-7994 A | 1/2016 |

OTHER PUBLICATIONS

International Search Report, Application No. PCT/JP2019/038547, dated Oct. 29, 2019. ISA/Japan Patent Office.

*Primary Examiner* — Jue Zhang
*Assistant Examiner* — Lakaisha Jackson
(74) *Attorney, Agent, or Firm* — Honigman LLP

(57) ABSTRACT

In a power distribution device, a current detection circuit detects a current value of a current flowing through a wire. When a switch is on, a microcomputer determines whether or not a predetermined condition is satisfied, based on the current value detected by the current detection circuit. If it is determined by the microcomputer that the predetermined condition is satisfied, a drive circuit turns off the switch.

3 Claims, 10 Drawing Sheets

(51) Int. Cl.
    *H01H 85/08*     (2006.01)
    *H03K 17/687*     (2006.01)
    *H02H 3/08*     (2006.01)

(56) References Cited

U.S. PATENT DOCUMENTS

| | | | |
|---|---|---|---|
| 2014/0347774 A1 | 11/2014 | Uehara | |
| 2015/0116883 A1* | 4/2015 | Kimoto | G01K 1/20 |
| | | | 361/103 |
| 2017/0025845 A1* | 1/2017 | Platise | H02H 3/085 |
| 2018/0191147 A1* | 7/2018 | Graf | H02H 3/08 |
| 2019/0066955 A1* | 2/2019 | Shiozaki | H03K 17/082 |

* cited by examiner

Legend
A= Environmental temperature
B= Precedent temperature difference
C= First temperature threshold
D= Second temperature threshold FIG. 7  Second control processing

FIG. 10

| Information table | 51 |
|---|---|
| A | ... |
| B | ... |
| Time threshold | ... |
| First flag | 0 |
| Second flag | 0 |

Legend
A= First current threshold
B= Second current threshold

POWER DISTRIBUTION DEVICE, POWER DISTRIBUTION METHOD, AND COMPUTER PROGRAM

CROSS-REFERENCE TO RELATED APPLICATIONS

This application is the U.S. national stage of PCT/JP2019/038547 filed on Sep. 30, 2019, which claims priority of Japanese Patent Application No. JP 2018-196859 filed on Oct. 18, 2018, the contents of which are incorporated herein.

TECHNICAL FIELD

The present disclosure relates to a power distribution device, a power distribution method, and a computer program.

BACKGROUND

Vehicles are provided with a power distribution device (see JP 2016-7994A) that distributes electric power supplied from a DC power supply via a wire over a plurality of loads via a plurality of supply paths. This power distribution device includes a fuse element that melts and breaks when an electric current whose current value is greater than or equal to a melting threshold continues to flow through it. The current flows from the positive electrode of the DC power supply to the fuse element and the wire in that order. The current output from the wire flows through the plurality of supply paths. If an electric current whose current value is greater than or equal to the melting threshold continues to flow through the wire, the fuse element will melt. Therefore, an over current is prevented from flowing through the wire.

When a large number of fuse elements such as fusible links or fuses are produced, not all of the melting thresholds of the produced fuse elements match each other, and so-called production variations occur in the melting thresholds of the fuse elements. The range of the production variations in the melting thresholds falls within a certain range.

In a conventional power distribution device such as the one described in JP 2016-7994A, the minimum value of the melting thresholds exceeds the maximum value of the current values of currents flowing through a wire when the power distribution device operates normally. Also, the conventional power distribution device uses a wire that does not produce smoke even if a current whose current value is the maximum value of the melting thresholds continues to flow therethrough.

The range of production variations in the melting thresholds of the fuse elements is large. In this case, since the maximum value of the melting thresholds is large, it is necessary to use a wire for which a permissible current having a large current value is specified. A wire for which a permissible current having a large current value is specified is typically thick and heavy. A thick wire is not preferred as a wire that is arranged in a vehicle, which has a limited space. A heavy wire is also not preferred as a wire that is installed in a vehicle, when fuel consumption is taken into consideration.

It is an object of the present disclosure to provide a power distribution device that can use a wire for which a permissible current having a small current value is specified, a power distribution method for the same, and a computer program.

SUMMARY

A power distribution device according to one aspect of the present disclosure distributes electric power supplied via a wire over a plurality of paths, and includes: a plurality of switches respectively provided on a plurality of supply paths; a current detection circuit configured to detect a current value of a current flowing through the wire; a condition determination unit configured to determine, when the plurality of switches are on, whether or not a predetermined condition is satisfied based on the current value detected by the current detection circuit; and a switching unit configured to turn off at least one of the plurality of switches if it is determined by the condition determination unit that the predetermined condition is satisfied.

A power distribution method according to one aspect of the present disclosure includes the steps of determining, when a plurality of switches respectively provided on a plurality of supply paths that are used to distribute electric power supplied via a wire are on, whether or not a predetermined condition is satisfied based on a current value of a current flowing through the wire; and turning off at least one of the plurality of switches if it is determined that the predetermined condition is satisfied.

A computer program according to one aspect of the present disclosure causes a computer to execute the steps of determining, when a plurality of switches respectively provided on a plurality of supply paths that are used to distribute electric power supplied via a wire are on, whether or not a predetermined condition is satisfied based on a current value of a current flowing through the wire; and giving an instruction to turn off at least one of the plurality of switches if it is determined that the predetermined condition is satisfied.

It should be noted that the present disclosure can be implemented not only as a power distribution device that includes such a characteristic processing unit, but also as a power distribution method that includes such characteristic processing as steps or a computer program for causing a computer to execute such steps. Also, the present disclosure can be implemented as a semiconductor integrated circuit that realizes a part or all of the power distribution device, or as a power supply system that includes the power distribution device.

Advantageous Effects of Present Disclosure

According to the present disclosure, it is possible to use a wire for which a permissible current having a small current value is specified.

BRIEF DESCRIPTION OF DRAWINGS

FIG. 10 is a diagram illustrating an information table according to Embodiment 2.

DETAILED DESCRIPTION OF PREFERRED EMBODIMENTS

Figure 1:
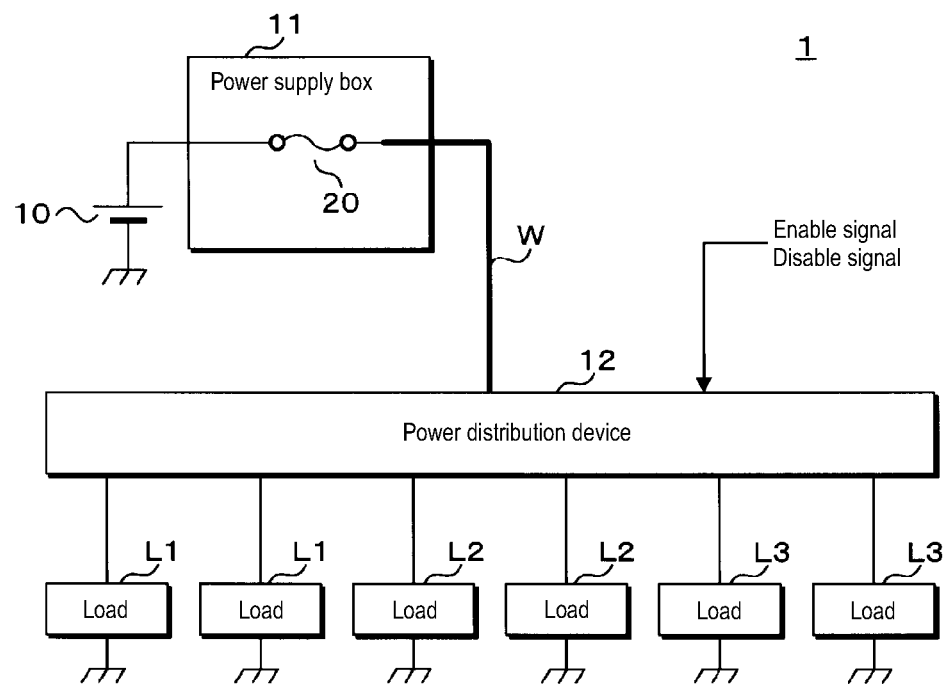
FIG. 1 is a block diagram illustrating a configuration of the main portion of a power supply system according to Embodiment 1.

First, embodiments of the present disclosure will be listed and described. At least some of the embodiments described below may be suitably combined with each other.

A power distribution device according to one aspect of the present disclosure distributes electric power supplied via a wire over a plurality of paths, and includes: a plurality of switches respectively provided on a plurality of supply paths; a current detection circuit configured to detect a current value of a current flowing through the wire; a condition determination unit configured to determine, when the plurality of switches are on, whether or not a predetermined condition is satisfied based on the current value detected by the current detection circuit; and a switching unit configured to turn off at least one of the plurality of switches if it is determined by the condition determination unit that the predetermined condition is satisfied.

The power distribution device according to one aspect of the present disclosure further includes a temperature calculation unit configured to calculate a wire temperature of the wire based on the current value detected by the current detection circuit, wherein the predetermined condition is that the wire temperature calculated by the temperature calculation unit is greater than or equal to a first temperature threshold.

The power distribution device according to one aspect of the present disclosure further includes a temperature determination unit configured to determine whether or not the wire temperature calculated by the temperature calculation unit is greater than or equal to a second temperature threshold, which is less than or equal to the first temperature threshold, after the at least one switch is turned off by the switching unit, wherein, if it is determined by the temperature determination unit that the wire temperature is greater than or equal to the second temperature threshold, the switching unit turns off at least another one of the plurality of switches that are on even after the at least one switch is turned off.

In the power distribution device according to one aspect of the present disclosure, if a time period in which the wire temperature calculated by the temperature calculation unit is greater than or equal to the second temperature threshold, which is less than or equal to the first temperature threshold, after the at least one switch is turned off by the switching unit is greater than or equal to a predetermined time period, the switching unit turns off at least another one of the plurality of switches that are on even after the at least one switch is turned off.

In the power distribution device according to one aspect of the present disclosure, the predetermined condition is that the current value detected by the current detection circuit is greater than or equal to a first current threshold.

The power distribution device according to one aspect of the present disclosure further includes a current determination unit configured to determine whether or not the current value detected by the current detection circuit is greater than or equal to a second current threshold, which is less than or equal to the first current threshold, after the at least one switch is turned off by the switching unit, wherein, if it is determined by the current determination unit that the current value is greater than or equal to the second current threshold, the switching unit turns off at least another one of the plurality of switches that are on even after the at least one switch is turned off.

In the power distribution device according to one aspect of the present disclosure, if a time period in which the current value detected by the current detection circuit is greater than or equal to the second current threshold, which is less than or equal to the first current threshold, after the at least one switch is turned off by the switching unit is greater than or equal to a second predetermined time period, the switching unit turns off at least another one of the plurality of switches that are on even after the at least one switch is turned off.

A power distribution method according to one aspect of the present disclosure includes the steps of determining, when a plurality of switches respectively provided on a plurality of supply paths that are used to distribute electric power supplied via a wire are on, whether or not a predetermined condition is satisfied based on a current value of a current flowing through the wire; and turning off at least one of the plurality of switches if it is determined that the predetermined condition is satisfied.

A computer program according to one aspect of the present disclosure causes a computer to execute the steps of determining, when a plurality of switches respectively provided on a plurality of supply paths that are used to distribute electric power supplied via a wire are on, whether or not a predetermined condition is satisfied based on a current value of a current flowing through the wire; and giving an instruction to turn off at least one of the plurality of switches if it is determined that the predetermined condition is satisfied.

With the power distribution device, the power distribution method, and the computer program according to the above-described aspects, it is assumed that, for example, a fuse element that melts and breaks when a current whose current value is greater than or equal to a melting threshold continues to flow therethrough is connected in series to the wire. A current flows through the fuse element and the wire, and is divided into the plurality of paths. When the plurality of switches respectively provided on the plurality of supply paths are on, if the value based on the current value of the current flowing through the wire, or this current value satisfies the predetermined condition, at least one of the switches is turned off. Accordingly, the maximum value of the current values of currents flowing through the wire is reduced when normal operation is executed.

The fuse element does not melt immediately even if the current value is greater than or equal to the melting threshold. Accordingly, the current value may exceed the melting threshold when the normal operation is executed. Even in this case, since the at least one switch is turned off before the fuse element melts and breaks, the there is a low likelihood that the fuse element may melt and break accidentally.

With this, when a large number of fuse elements are produced, the minimum value of the melting thresholds of the produced fuse elements may be less than the maximum value of the current values of currents flowing through the wire when the normal operation is executed. In this case, since the maximum value of the melting thresholds is low, it is possible to use a wire for which a permissible current having a small current value is specified.

With the power distribution device according to the above-described one aspect, when the plurality of switches are on, the at least one switch is turned off if the wire temperature is greater than or equal to the first temperature threshold.

With the power distribution device according to the above-described aspect, if the wire temperature is greater than or equal to the second temperature threshold after the at least one switch is turned off, at least another one of the plurality of switches that are on is turned off. Therefore, there is a lower likelihood that the fuse element may melt and break accidentally although the normal operation is executed.

With the power distribution device according to the above-described one aspect, if the time period in which the wire temperature is greater than or equal to the second temperature threshold although the at least one switch is turned off is greater than or equal to the predetermined time period, at least another one of the plurality of switches that are on is turned off. Therefore, there is a lower likelihood that the fuse element may melt and break accidentally although the normal operation is executed.

With the power distribution device according to the above-described one aspect, when the plurality of switches are on, at least one of the plurality of switches is turned off if the current value is greater than or equal to the first current threshold.

With the power distribution device according to the above-described one aspect, if the current value of a current flowing through the wire is greater than or equal to the second current threshold after the at least one switch is turned off, at least another one of the plurality of switches that are on is turned off. Therefore, there is a lower likelihood that the fuse element may melt and break accidentally although the normal operation is executed.

With the power distribution device according to the above-described one aspect, if the time period in which the current value of the current flowing through the wire is greater than or equal to the second current threshold although the at least one switch is turned off is greater than or equal to the predetermined time period, at least another one of the plurality of switches that are on is turned off. Therefore, there is a lower likelihood that the fuse element may melt and break accidentally although the normal operation is executed.

Specific examples of the power distribution device according to the present disclosure will be described below with reference to the drawings. Note that the present disclosure is not limited to these examples but is defined by the claims, and the present disclosure is intended to include all changes within the meaning and scope that are equivalent to the claims.

Embodiment 1

FIG. 1 is a block diagram showing a configuration of the main portion of a power supply system 1 of Embodiment 1. The power supply system 1 is suitably installed in a vehicle, and includes a battery 10, a power supply box 11, a power distribution device 12, six loads L1, L2, and L3, and a wire W. The power supply box 11 houses a fuse element 20 such as a fusible link or fuse.

The positive electrode of the battery 10 is connected to one end of the fuse element 20 of the power supply box 11. The negative electrode of the battery 10 is grounded. The other end of the fuse element 20 is connected to one end of the wire W. The other end of the wire W is connected to the power distribution device 12. The power distribution device 12 is further connected to the ends, on one side, of the six loads L1, L2, and L3. The ends, on the other side, of the loads L1, L2, and L3 are grounded.

The battery 10 supplies power to the power distribution device 12 via the fuse element 20 and the wire W. At this time, a current flows from the positive electrode of the battery 10 to the fuse element 20 and the wire W in that order. The fuse element 20 melts and breaks if a current whose current value is greater than or equal to a melting threshold continues to flow through the fuse element 20. Accordingly, the flow of current through the wire W is interrupted, and the wire W is protected against the over current.

An enable signal, which indicates enabling power supply to the six loads L1, L2, and L3, and a disable signal, which indicates disabling the power supply to the six loads L1, L2, and L3, are input to the power distribution device 12. The enable signal is a signal indicating that an ignition switch of the vehicle has been turned on, for example. The disable signal is a signal indicating that the ignition switch has been turned off, for example.

Upon input of the enable signal, the power distribution device 12 distributes the power supplied from the battery 10 via the wire W over the six loads L1, L2, and L3. Each of the loads L1, L2, and L3 is an electric instrument installed in the vehicle, and operates with the power supplied from the power distribution device 12. Upon input of the disable signal, the power distribution device 12 stops the distribution of the power over the six loads L1, L2, and L3.

The power distribution device 12 repeatedly calculates the wire temperature of the wire W based on the current value (hereinafter, referred to also as "wire current value") of a current flowing through the wire W. The power distribution device 12 changes power distribution targets, out of the six loads L1, L2, and L3, based on the calculated wire temperature.

Figure 2:
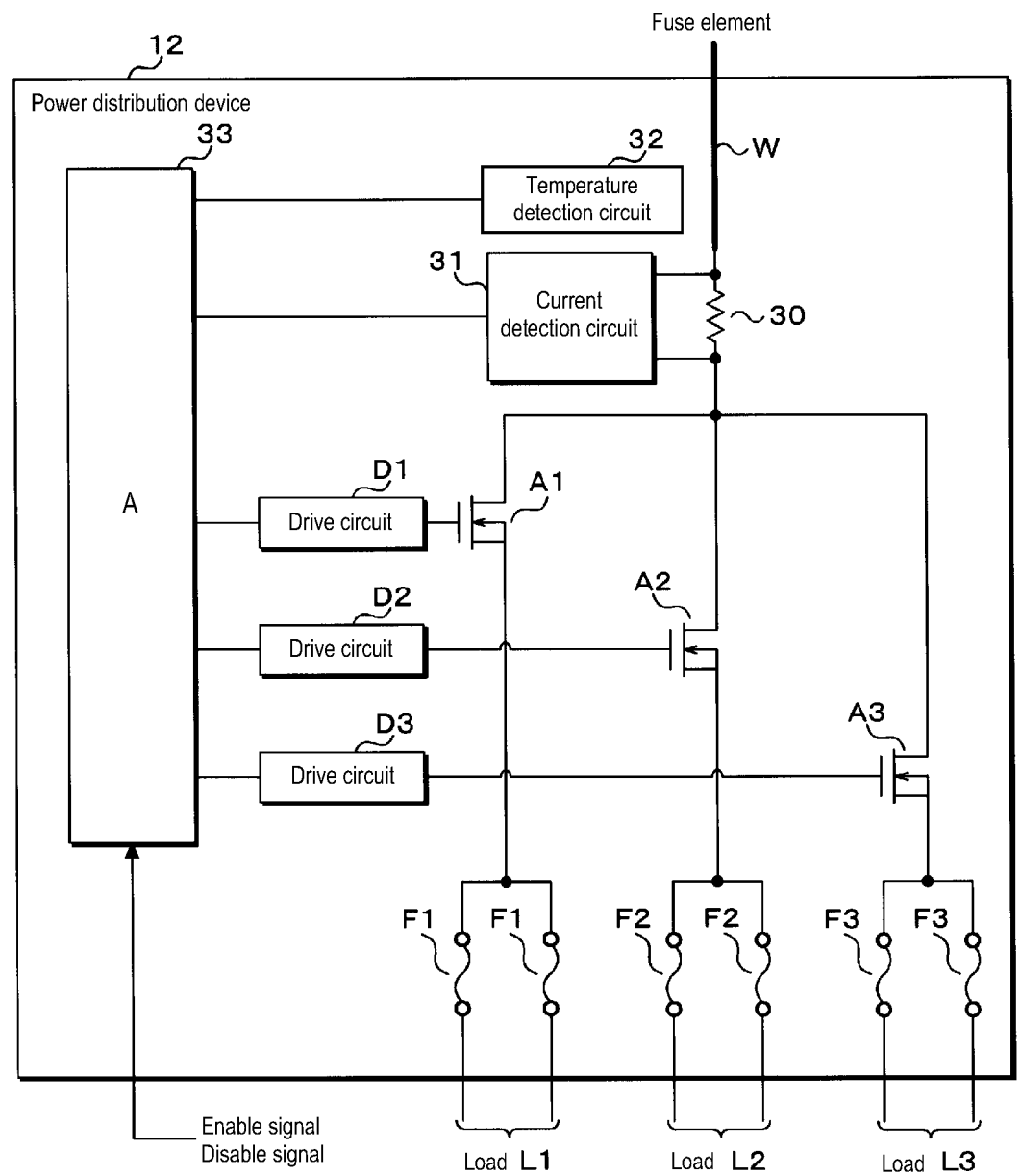
FIG. 2 is a block diagram illustrating a configuration of the main portion of a power distribution device.

FIG. 2 is a block diagram showing a configuration of the main portion of the power distribution device 12. The power distribution device 12 includes a resistor 30, a current detection circuit 31, a temperature detection circuit 32, a microcomputer 33, three switches A1, A2, and A3, three drive circuits D1, D2, and D3, and six fuse elements F1, F2, and F3. Each of the switches A1, A2, and A3 is an N-channel type FET (Field Effect Transistor).

As described above, one end of the wire W is connected to the other end of the fuse element 20 of the power supply box 11. The other end of the wire W is connected to one end of the resistor 30. The other end of the resistor 30 is connected to the drains of the respective switches A1, A2, and A3. The source of the switch A1 is connected to the ends, on one side, of the two fuse elements F1. The ends, on the other side, of the two fuse elements F1 are respectively connected to the ends, on one side, of the two loads L1.

Similarly, the source of the switch A2 is connected to the ends, on one side, of the two fuse elements F2. The ends, on the other side, of the two fuse elements F2 are respectively connected to the ends, on one side, of the two loads L2. The source of the switch A3 is connected to the ends, on one side, of the two fuse elements F3. The ends, on the other side, of the two fuse elements F3 are respectively connected to the ends, on one side, of the two loads L3.

The one end and the other end of the resistor 30 are separately connected to the current detection circuit 31. The gates of the switches A1, A2, and A3 are respectively connected to the drive circuits D1, D2, and D3. The current detection circuit 31, the temperature detection circuit 32, and the drive circuits D1, D2, and D3 are separately connected to the microcomputer 33.

If the voltage value of the gate of each of the switches A1, A2, and A3 with respect to the potential of the source is greater than or equal to a predetermined voltage value, a current can flow through the drain and the source thereof. At this time, the switches A1, A2, and A3 are on. If the voltage value of the gate of each of the switches A1, A2, and A3 with respect to the potential of the source is less than the predetermined voltage value, no current will flow through the drain and the source thereof. At this time, the switches A1, A2, and A3 are off.

The microcomputer 33 outputs a high-level voltage or low-level voltage to each of the drive circuits D1, D2, and D3. When the voltage input from the microcomputer 33 is switched from the low-level voltage to the high-level voltage, the drive circuit D1 increases the voltage value of the gate of the switch A1 with respect to a ground potential. Accordingly, in the switch A1, the voltage value of the gate with respect to the potential of the source is greater than or equal to a predetermined value, and the switch A1 is turned on.

When the voltage input from the microcomputer 33 is switched from the high-level voltage to the low-level voltage, the drive circuit D1 decreases the voltage value of the gate of the switch A1 with respect to the ground potential. Accordingly, in the switch A1, the voltage value of the gate with respect to the potential of the source is less than the predetermined value, and the switch A1 is turned off.

Similar to the drive circuit D1, the drive circuits D2 and D3 respectively turn on or off the switches A2 and A3 based on the voltage input from the microcomputer 33. In the description of the switching performed by the drive circuit D1, when the switch A1 and the drive circuit D1 are respectively replaced by the switch A2 and the drive circuit D2, a description of switching that is performed by the drive circuit D2 can be given. In the description of the switching performed by the drive circuit D1, when the switch A1 and the drive circuit D1 are respectively replaced by the switch A3 and the drive circuit D3, a description of switching that is performed by the drive circuit D3 can be given.

When the switch A1 is on, a current flows from the positive electrode of the battery 10 to the fuse elements 20, the wire W, the resistor 30, the switch A1, the fuse elements F1, and the loads L1 in this order, and power is supplied to the loads L1. In this way, the switch A1 is provided on a supply path through which power is supplied from the other end of the wire W to the loads L1. When the switch A1 is on, power is supplied to the two loads L1. When the switch A1 is off, no power is supplied to the two loads L1, and the two loads L1 are deactivated.

Similarly, when the switch A2 is on, a current flows from the positive electrode of the battery 10 to the fuse elements 20, the wire W, the resistor 30, the switch A2, the fuse elements F2, and the loads L2 in this order, and the power is supplied to the loads L2. In this way, the switch A2 is provided on a supply path through which power is supplied from the other end of the wire W to the loads L2. When the switch A2 is on, power is supplied to the two loads L2. When the switch A2 is off, no power is supplied to the two loads L2, and the two loads L2 are deactivated.

Also, when the switch A3 is on, a current flows from the positive electrode of the battery 10 to the fuse element 20, the wire W, the resistor 30, the switch A3, the fuse elements F3, and the loads L3 in that order, and power is supplied to the loads L3. In this way, the switch A3 is provided on a supply path through which power is supplied from the other end of the wire W to the loads L3. When the switch A3 is on, power is supplied to the two loads L3. When the switch A3 is off, no power is supplied to the two loads L3, and the two loads L3 are deactivated.

In the power distribution device 12, the power supplied from the battery 10 via the wire W is distributed over the six loads L1, L2, and L3 via the three supply paths. The number N of supply paths is 3.

If a current whose current value is greater than or equal to a predetermined threshold continues to flow through the fuse elements F1, F2, and F3, the fuse elements F1, F2, and F3 will melt. Accordingly, the wire connected to the ends, on one side, of the loads L1, L2, and L3 is protected from an over current. Each of the fuse elements F1, F2, and F3 is a fusible link, a fuse, or the like.

The current detection circuit 31 detects the current value of a current flowing through the resistor 30, that is, a wire current value. The current detection circuit 31 outputs analog current information indicating the detected wire current value to the microcomputer 33. The current information refers to, for example, a voltage value that is proportional to the wire current value.

The temperature detection circuit 32 detects, in the vehicle, the environmental temperature of an environment in which the power distribution device 12 is arranged. The environmental temperature is, for example, the ambient temperature of the wire W. The temperature detection circuit 32 is constituted by, for example, a thermistor, whose resistance value changes with environmental temperature. The temperature detection circuit 32 outputs analog temperature information indicating the detected environmental temperature to the microcomputer 33. The temperature information refers to, for example, a voltage value that changes with the environmental temperature.

An enable signal and a disable signal are input to the microcomputer 33. The microcomputer 33 switches a voltages that are output to each of the drive circuits D1, D2, and D3 to a high-level voltage or a low-level voltage based on the input signal, the wire current value indicated by the current information input from the current detection circuit 31, and the environmental temperature indicated by the temperature information input from the temperature detection circuit 32. As described above, the drive circuits D1, D2, and D3 respectively turn on or off the switches A1, A2, and A3 according to the voltages output from the microcomputer 33.

Figure 3:
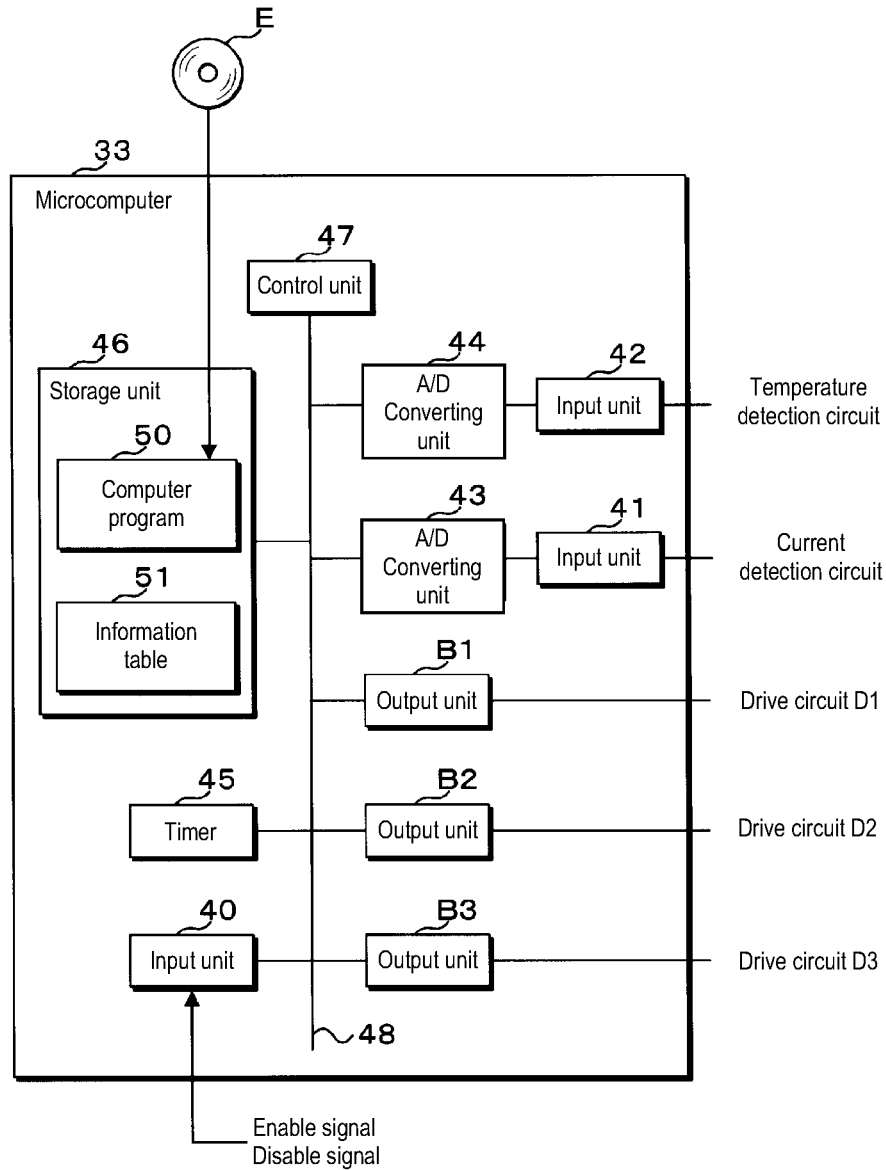
FIG. 3 is a block diagram illustrating a configuration of the main portion of a microcomputer.

FIG. 3 is a block diagram showing a configuration of the main portion of the microcomputer 33. The microcomputer 33 includes input units 40, 41, and 42, A/D converting units 43 and 44, a timer 45, a storage unit 46, a control unit 47, and output units B1, B2, and B3. The input unit 40, the A/D converting units 43 and 44, the timer 45, the storage unit 46, the control unit 47, and the output units B1, B2, and B3 are connected to an internal bus 48.

The A/D converting units 43 and 44 are respectively connected to the input units 41 and 42. The input unit 41 is further connected to the current detection circuit 31. The input unit 42 is further connected to the temperature detection circuit 32.

An enable signal and a disable signal are input to the input unit 40. Upon input of an enable signal or a disable signal, the input unit 40 notifies the control unit 47 of the input signal.

The analog current information is input from the current detection circuit 31 to the input unit 41. Upon input of the analog current information, the input unit 41 outputs the input analog current information to the A/D converting unit 43. The A/D converting unit 43 converts the analog current information input from the input unit 41 into digital current information. The control unit 47 acquires, from the A/D converting unit 43, the digital current information converted by the A/D converting unit 43.

The analog temperature information is input from the temperature detection circuit 32 to the input unit 42. Upon input of the analog temperature information, the input unit 42 outputs the input analog temperature information to the A/D converting unit 44. The A/D converting unit 44 converts the analog current information input from the input unit 42 into digital current information. The control unit 47 acquires, from the A/D converting unit 44, the digital current information converted by the A/D converting unit 44.

Each of the output units B1, B2, and B3 outputs a high-level voltage or a low-level voltage to the corresponding one of the drive circuits D1, D2, and D3. Each of the output units B1, B2, and B3 switches the voltage that is output to the corresponding one of the drive circuits D1, D2, and D3 to a high-level voltage or a low-level voltage in accordance with an instruction from the control unit 47. Each of the drive circuits D1, D2, and D3 turns on or off the corresponding one of the switches A1, A2, and A3 according to the voltage input from the corresponding one of the output units B1, B2, and B3.

When the output unit B1 outputs a high-level voltage, the switch A1 is on. When the output unit B1 outputs a low-level voltage, the switch A1 is off. Similarly, when the output unit B2 outputs a high-level voltage, the switch A2 is on. When the output unit B2 outputs a low-level voltage, the switch A2 is off. Also, when the output unit B3 outputs a high-level voltage, the switch A3 is on. When the output unit B3 outputs a low-level voltage, the switch A3 is off.

The timer 45 starts and ends measuring time in accordance with an instruction from the control unit 47. The measured time measured by the timer 45 is read by the control unit 47 from the timer 45.

The storage unit 46 is a nonvolatile memory. A computer program 50 and an information table 51 are stored in the storage unit 46. The control unit 47 includes a processing element, e.g., a CPU (Central Processing Unit) that performs processing. The processing element of the control unit 47 executes, by executing the computer program 50, first control processing and second control processing for controlling power supply to the six loads L1, L2, and L3, and temperature calculation processing for calculating the wire temperature of the wire W. The control unit 47 executes the first control processing, the second control processing, and the temperature calculation processing in parallel to each other in a time division manner. The computer program 50 is used to cause the processing element (computer) of the control unit 47 to execute the first control processing, the second control processing, and the temperature calculation processing.

Note that the computer program 50 may be stored in a storage medium E so as to be readable by the processing element of the control unit 47. In this case, the computer program 50 read out from the storage medium E by a not-shown reading device is stored in the storage unit 46. The storage medium E is an optical disk, a flexible disk, a magnetic disk, a magnetooptical disk, a semiconductor memory, or the like. The optical disk is a CD (Compact Disc)-ROM (Read Only Memory), a DVD (Digital Versatile Disc)-ROM, a BD (Blu-ray (registered trademark) Disc), or the like. The magnetic disk is a hard disk, for example. Also, the computer program 50 may be downloaded from a not-shown external device connected to a not-shown communication network, and the downloaded computer program 50 may be stored in the storage unit 46.

Also, the number of processing elements included in the control unit 47 is not limited to one but may be two or more. If the control unit 47 includes a plurality of processing elements, the plurality of processing elements may cooperate with each other to execute the first control processing, the second control processing, and the temperature calculation processing.

The control unit 47 periodically executes the temperature calculation processing. In the temperature calculation processing, the control unit 47 calculates a temperature difference between the environmental temperature of the environment in which the power distribution device 12 is arranged, and the wire temperature of the wire W, and adds the environmental temperature to the calculated temperature difference, thereby calculating the wire temperature. The temperature difference is calculated based on the environmental temperature, the precedent temperature difference calculated in the previous temperature calculation processing, and the wire current value.

Figure 4:
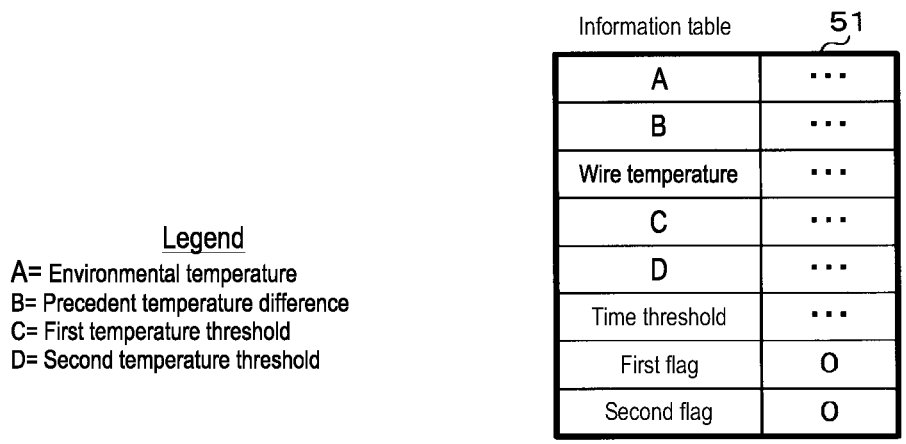
FIG. 4 is a diagram illustrating an information table.

FIG. 4 is a diagram showing the information table 51. The information table 51 indicates various types of information for use in the first control processing, the second control processing, and the temperature calculation processing. As shown in FIG. 4, the information table 51 includes an environmental temperature field, a precedent temperature difference field, a wire temperature field, a first temperature threshold field, a second temperature threshold field, a time threshold field, a first flag field, and a second flag field.

An environmental temperature, a precedent temperature difference, and a wire temperature are respectively stored in the environmental temperature field, the precedent temperature difference field, and the wire temperature field. These values are updated by the control unit 47. A first temperature threshold and a second temperature threshold for use in comparison with a wire temperature are respectively stored in the first temperature threshold field and the second temperature threshold field. A time threshold for use in comparison with a measured time measured by the timer 45 is stored in the time threshold field. The first temperature threshold, the second temperature threshold, and the time threshold are each a constant value, and are stored in advance. The second temperature threshold is less than or equal to the first temperature threshold.

A value of a first flag is stored in the first flag field. The value of the first flag is 0 or 1. The value of the first flag is also updated by the control unit 47. When the value of the first flag is 0, this means that the switch A1 is on. When the value of the first flag is 1, this means that the switch A1 is off.

Similarly, a value of a second flag is stored in the second flag field. The value of the second flag is 0 or 1. The value of the second flag is also updated by the control unit 47. When the value of the second flag is 0, this means that the switch A2 is on. When the value of the second flag is 1, this means that the switch A2 is off.

Figure 5:
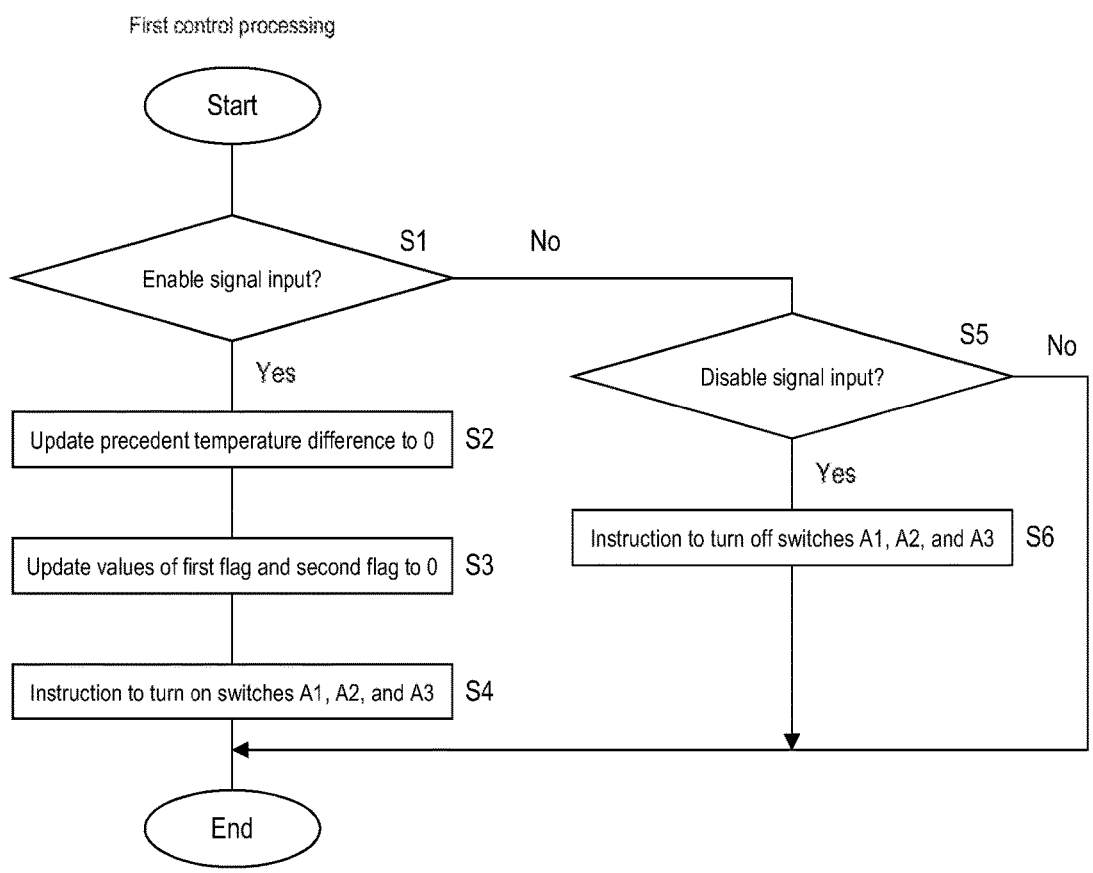
FIG. 5 is a flowchart illustrating a procedure of first control processing.

FIG. 5 is a flowchart showing a procedure of the first control processing. The control unit 47 periodically executes the first control processing. In the first control processing, the control unit 47 first determines whether or not an enable signal has been input to the input unit 40 (step S1). If it is determined that an enable signal has been input (YES in step S1), the control unit 47 updates the precedent temperature difference in the information table 51 to 0 (step S2), and updates the values of the first flag and the second flag to 0 (step S3). At the point in time when the enable signal is input to the input unit 40, the wire temperature is regarded as substantially matching the environmental temperature, and in step S2, the control unit 47 updates the precedent temperature difference to 0.

Then, the control unit 47 instructs the output units B1, B2, and B3 to turn on the respective switches A1, A2, and A3 (step S4). In response thereto, the output units B1, B2, and B3 respectively switch the voltages that are output to the drive circuits D1, D2, and D3 to a high-level voltage. The drive circuits D1, D2, and D3 turn on the respective switches A1, A2, and A3.

When the switches A1, A2, and A3 are on, power supplied from the positive electrode of the battery 10 via the wire W is distributed over the six loads L1, L2, and L3 via the three supply paths in which the switches A1, A2, and A3 are respectively provided.

If it is determined that an enable signal has not been input (NO in step S1), the control unit 47 determines whether or not a disable signal has been input to the input unit 40 (step S5). If it is determined that a disable signal has been input (YES in step S5), the control unit 47 instructs the output units B1, B2, and B3 to turn off the respective switches A1, A2, and A3 (step S6).

In response thereto, the output units B1, B2, and B3 respectively switch the voltages that are output to the drive circuits D1, D2, and D3 to a low-level voltage. The drive circuits D1, D2, and D3 turn off the respective switches A1, A2, and A3. When the switches A1, A2, and A3 are turned off, the power supply to the six loads L1, L2, and L3 is stopped.

After the control unit 47 has executed one of steps S4 and S6, or if it is determined that a disable signal has not been input (NO in step S5), the control unit 47 ends the first control processing.

As described above, in the power distribution device 12, when an enable signal is input to the input unit 40, the drive circuits D1, D2, and D3 respectively turn on the switches A1, A2, and A3, and power supplied via the wire W is distributed over the six loads L1, L2, and L3. When a disable signal is input to the input unit 40, the drive circuits D1, D2, and D3 respectively turn off the switches A1, A2, and A3, and the power supply to the six loads L1, L2, and L3 is stopped.

Figure 6:
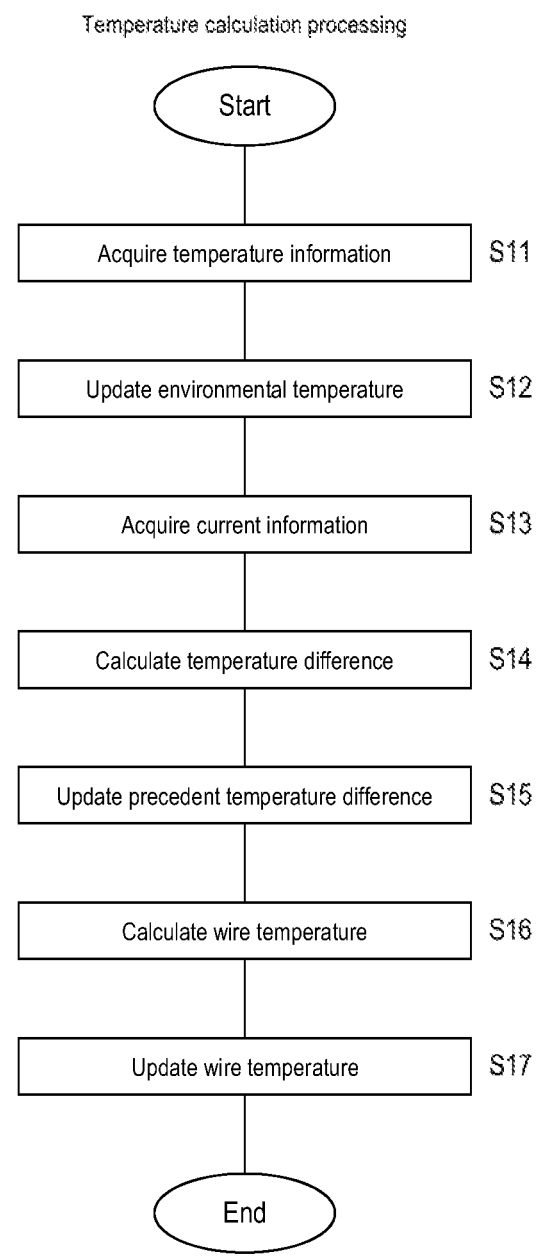
FIG. 6 is a flowchart illustrating a procedure of temperature calculation processing.

FIG. 6 is a flowchart showing a procedure of the temperature calculation processing. The control unit 47 periodically executes the temperature calculation processing during a time period from when an enable signal is input to the input unit 40 to when a disable signal is input to the input unit 40. In the temperature calculation processing, the control unit 47 first acquires temperature information from the A/D converting unit 44 (step S11). Then, the control unit 47 updates the environmental temperature in the information table 51 to the environmental temperature indicated by the temperature information acquired in step S11 (step S12). After the execution of step S12, the control unit 47 acquires current information from the A/D converting unit 43 (step S13). The wire current value indicated by the current information acquired from the A/D converting unit 43 is the wire current value detected by the current detection circuit 31.

As described above, in the temperature calculation processing, the control unit 47 calculates the temperature difference between the wire temperature and the environmental temperature. The control unit 47 updates the precedent temperature difference in the information table 51 to the calculated temperature difference. Therefore, the precedent temperature difference in the information table 51 is the temperature difference calculated in the previous temperature calculation processing. In the temperature calculation processing that is first executed after an enable signal has been input to the input unit 40, the precedent temperature difference is regarded as 0.

After the execution of step S13, the control unit 47 calculates the temperature difference between the wire temperature and the environmental temperature, based on the environmental temperature and the precedent temperature difference in the information table 51, and the wire current value indicated by the current information acquired in step S13 (step S14). In step S14, the control unit 47 calculates, based on the precedent temperature difference, a temperature difference that was reduced due to heat dissipation during the execution of one cycle of the temperature calculation processing. Furthermore, the control unit 47 calculates an amount of increase in the wire temperature increased due to heat generation during the execution of one cycle of the temperature calculation processing, based on the environmental temperature, the precedent temperature difference, and the wire current value.

The control unit 47 calculates the temperature difference between the wire temperature and the environmental temperature by adding the amount of increase in the wire temperature increased due to the heat generation to the temperature difference reduced due to the heat dissipation.

Then, the control unit 47 updates the precedent temperature difference in the information table 51 to the temperature difference calculated in step S14 (step S15). The updated precedent temperature difference is used to calculate the temperature difference in the next temperature calculation processing. After the execution of the step S15, the control unit 47 calculates the wire temperature of the wire W by adding the environmental temperature in the information table 51 to the temperature difference calculated in step S14 (step S16). The control unit 47 functions as a temperature calculation unit. Then, the control unit 47 updates the wire temperature in the information table 51 to the wire temperature calculated in step S16 (step S17), and ends the temperature calculation processing.

As described above, the control unit 47 periodically executes the temperature calculation processing, and updates the wire temperature in the information table 51. The wire temperature in the information table 51 indicates the latest wire temperature.

Figure 7:
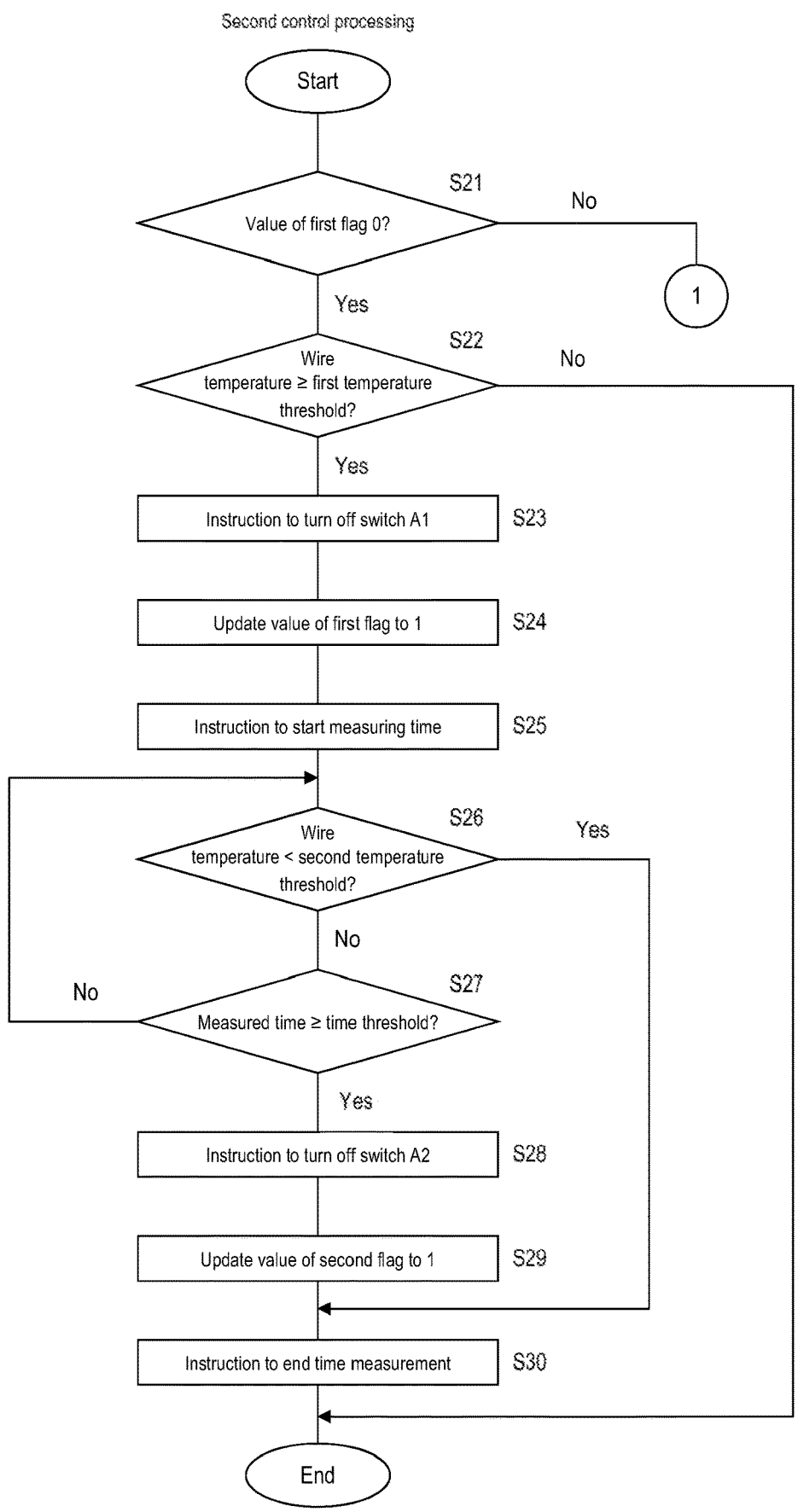
FIG. 7 is a flowchart illustrating a procedure of second control processing.
Figure 8:
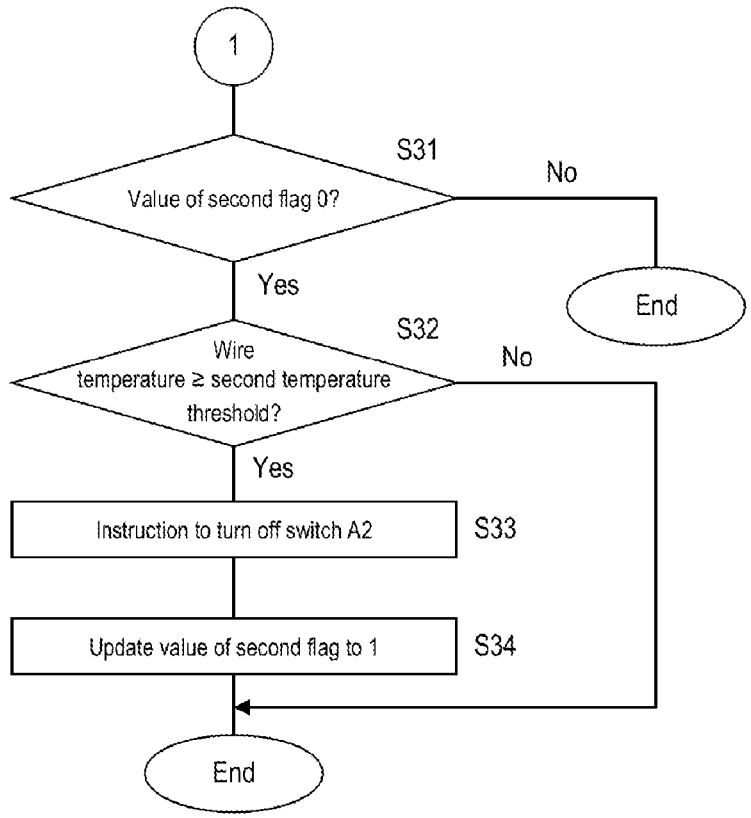
FIG. 8 is a flowchart illustrating the procedure of the second control processing.

FIGS. 7 and 8 are flowcharts showing a procedure of the second control processing. The control unit 47 periodically executes the second control processing during the time period from when an enable signal is input to the input unit 40 to when a disable signal is input to the input unit 40. A period in which the temperature calculation processing is executed is sufficiently shorter than a period in which the second control processing is executed. Therefore, the wire temperature in the information table 51 is updated also during the execution of the second control processing.

In the second control processing, the control unit 47 first determines whether or not the value of the first flag in the information table 51 is 0 (step S21). If it is determined that the value of the first flag is 0 (YES in step S21), the control unit 47 determines whether or not the wire temperature in the information table 51 is greater than or equal to the first temperature threshold in the information table 51 (step S22).

As described above, the control unit 47 periodically executes the second control processing during the time period from when an enable signal is input to the input unit 40 to when a disable signal is input to the input unit 40. Also, in the second control processing, when an enable signal is input to the input unit 40, the drive circuits D1, D2, and D3 turn on the switches A1, A2, and A3, and the control unit 47 updates the values of the first flag and the second flag to 0. Also, in a state in which the value of the first flag is 0, the value of the second flag is not updated to 1. Accordingly, in step S21, when the value of the first flag is 0, this means that the switches A1, A2, and A3 are on. Accordingly, step S22 is executed in a state in which the switches A1, A2, and A3 are on.

The wire temperature in the information table 51 is a value that is calculated based on the wire current value indicated by the current information, that is, the wire current value detected by the current detection circuit 31 in the temperature calculation processing. The control unit 47 also functions as a condition determination unit. A predetermined condition is that the wire temperature is greater than or equal to the first temperature threshold.

If it is determined that the wire temperature is greater than or equal to the first temperature threshold (YES in step S22), the control unit 47 instructs the output unit B1 to turn off the switch A1 (step S23). In response thereto, the output unit B1 switches the voltage that is output to the drive circuit D1 to a low-level voltage, and the drive circuit D1 turns off the switch A1. The drive circuits D1, D2, and D3 function together as a switching unit. The number K of switches A1 is 1. K is a natural number less than N since, as described above, N is 3. Also, N and K satisfy N≥K+2.

When the switch A1 is turned off, the power supply to the two loads L1 via the switch A1 is stopped. Accordingly, the wire current value is reduced, and the wire temperature is also reduced. Furthermore, the maximum value of wire current values when normal operation is executed in the power supply system 1 is also reduced.

After the execution of step S23, the control unit 47 updates the value of the first flag in the information table 51 to 1 (step S24). Then, the control unit 47 instructs the timer 45 to start measuring time (step S25), and determines whether or not the wire temperature in the information table 51 is less than the second temperature threshold in the information table 51 (step S26).

If it is determined that the wire temperature is greater than or equal to the second temperature threshold (NO in step S26), the control unit 47 determines whether or not the measured time measured by the timer 45 is greater than or equal to the time threshold in the information table 51 (step S27). Determining whether or not the measured time is greater than or equal to the time threshold in step S27 corresponds to determining whether or not the time period in which the wire temperature in the information table 51 is greater than or equal to the second temperature threshold after the drive circuit D1 has turned off the switch A1 is greater than or equal to the time threshold. When the measured time is greater than or equal to the time threshold, this means that the time period in which the wire temperature in the information table 51 is greater than or equal to the second temperature threshold after the drive circuit D1 has turned off the switch A1 is greater than or equal to the time threshold. The control unit 47 also functions as a time period determination unit.

If it is determined that the measured time is less than the time threshold (NO in step S27), the control unit 47 executes step S26, and stands by until the wire temperature is less than the second temperature threshold, or the measured time is greater than or equal to the time threshold. If it is determined that the measured time is greater than or equal to the time threshold (YES in step S27), the control unit 47 instructs the output unit B2 to turn off the switch A2 (step S28). In response thereto, the output unit B2 switches the voltage that is output to the drive circuit D2 to a low-level voltage, and the drive circuit D2 turns off the switch A2. At the point in time when step S27 is executed, the switch A1 is off, and the switches A2 and A3 are on. The number of switches A2 corresponds to M, and is 1. As described above, N is 3 and K is 1. M is a natural number less than (N−K).

When the switch A2 is turned off, the power supply to the two loads L2 via the switch A2 is stopped. Accordingly, the wire current value is reduced, and the wire temperature is also reduced. Furthermore, the maximum value of the wire current values when normal operation is executed in the power supply system 1 is also reduced.

After the execution of step S28, the control unit 47 updates the value of the second flag in the information table 51 to 1 (step S29). If it is determined that the wire temperature is less than the second temperature threshold (YES in step S26), or after the execution of step S29, the control unit 47 instructs the timer 45 to end the time measurement (step S30). In response thereto, the timer 45 ends the time measurement. If it is determined that the wire temperature is less than or equal to the first temperature threshold (NO in step S22), or after the execution of step S30, the control unit 47 ends the second control processing.

If the time period in which the wire temperature is greater than or equal to the second temperature threshold after the drive circuit D1 has turned off the switch A1 is greater than or equal to the time threshold, the drive circuit D2 turns off the switch A2, and the control unit 47 updates the value of the second flag to 1. In this case, the control unit 47 ends the second control processing in a state in which the values of the first flag and the second flag are 1. If the wire temperature is reduced to a value less than the second temperature threshold before the time period in which the wire temperature is greater than or equal to the second temperature threshold after the drive circuit D1 has turned off the switch A1 is greater than or equal to the time threshold, the control unit 47 ends the second control processing in a state in which the values of the first flag and the second flag are respectively 1 and 0.

If it is determined that the value of the first flag is not 0, that is, the value of the first flag is 1 (NO in step S21), the control unit 47 determines whether or not the value of the second flag in the information table 51 is 0 (step S31). When the values of the first flag and the second flag are respectively 1 and 0, this means that after the drive circuit D1 has turned off the switch A1, the wire temperature calculated by the control unit 47 in the temperature calculation processing is reduced to a value less than the second temperature threshold.

If it is determined that the value of the second flag is not 0, that is, the value of the second flag is 1 (NO in step S31), the control unit 47 ends the second control processing. As described above, when the value of the second flag is 1, this means that the switch A2 is off.

If it is determined that the value of the second flag is 0 (YES in step S31), the control unit 47 determines whether or not the wire temperature in the information table 51 is greater than or equal to the second temperature threshold in the information table 51 (step S32). The control unit 47 also functions as a temperature determination unit. If it is determined that the wire temperature is greater than or equal to the second temperature threshold (YES in step S32), the control unit 47 instructs the output unit B2 to turn off the switch A2 (step S33). In response thereto, the output unit B2 switches the voltage that is output to the drive circuit D2 to a low-level voltage, and the drive circuit D2 turns off the switch A2. At the point in time when step S33 is executed, the switch A1 is off, and the switches A2 and A3 are on.

As described above, when the switch A2 is turned off, the power supply to the two loads L2 via the switch A2 is stopped. Accordingly, the wire current value is reduced, and the wire temperature is also reduced. Furthermore, the maximum value of the wire current values when normal operation is executed in the power supply system 1 is also reduced.

After the execution of step S33, the control unit 47 updates the value of the second flag in the information table 51 to 1 (step S34). If it is determined that the wire temperature is less than the second temperature threshold (NO in step S32), or after the execution of step S34, the control unit 47 ends the second control processing.

As described above, in the power distribution device 12, if the wire temperature is greater than or equal to the first temperature threshold, the drive circuit D1 turns off the switch A1. If the time period in which the wire temperature is greater than or equal to the second temperature threshold after the drive circuit D1 has turned off the switch A1 is greater than or equal to the time threshold, the drive circuit D2 turns off the switch A2. The drive circuit D2 also turns off the switch A2 if the wire temperature is reduced to a value less than the second temperature threshold, and then is increased to a value greater than or equal to the second temperature threshold. Accordingly, the maximum value of the wire current values when normal operation is executed in the power supply system 1 is reduced. The switch A3 is kept on until a disable signal is input to the input unit 40.

Accordingly, after the power supply to the loads L1 has been stopped, the power supply to the loads L2 is stopped. The power supply to the loads L3 is continued unless a disable signal is input. The loads L3 are more important than the loads L1 and L2, and the loads L2 are more important than the loads L1. The loads L3 are, for example, electric instruments that act on the driving of the vehicle. The loads L1 and L2 are, for example, electric instruments that do not directly act on the driving of the vehicle. Examples of the electric instruments that act on the driving of the vehicle include a headlamp and a brake lamp. Examples of the electric instruments that do not act on the driving of the vehicle include a windshield wiper, an air conditioner, and a car navigation system.

Figure 9:
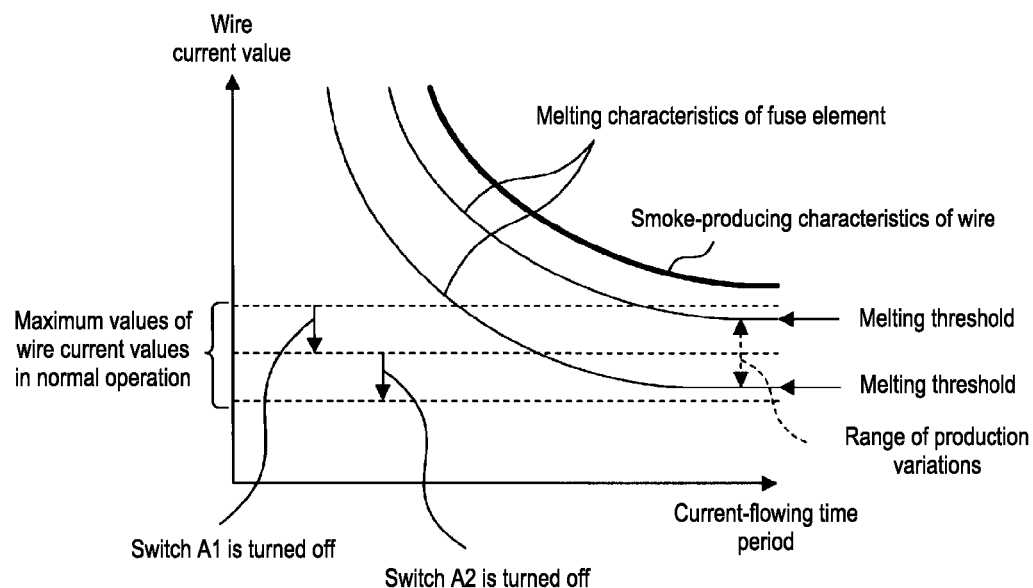
FIG. 9 illustrates effects of the power distribution device.

FIG. 9 is a diagram illustrating effects of the power distribution device 12. FIG. 9 shows the smoke-producing characteristics of the wire W and the melting characteristics of the fuse element 20. The wire current value is plotted on the vertical axis. The current-flowing time period in which a current is flowing through the wire W is plotted on the horizontal axis. The wire current value also serves as the current value of a current flowing through the fuse element 20. The current-flowing time period in which a current is flowing through the wire W corresponds to a time period in which a current is flowing through the fuse element 20.

The smoke-producing characteristics of the wire W indicate the wire current value at which smoke is produced, and the current-flowing time period in which smoke is produced. Smoke is produced in a shorter current-flowing time period the greater the wire current value is. The melting characteristics of the fuse element 20 indicate the wire current value at which melting occurs, and the current-flowing time period in which melting occurs. The fuse element 20 melts and breaks in a shorter current-flowing time period the greater the wire current value is. With respect to the fuse element 20, the minimum value of the wire current values at which melting occurs is the melting threshold.

When a large number of fuse elements 20 are produced, not all of the melting thresholds of the produced fuse elements 20 match each other, and so-called production variations occur in the melting thresholds of the fuse elements 20. FIG. 9 shows the melting characteristics of the maximum melting threshold, and the melting characteristics of the minimum melting threshold. The range of the production variations in the melting threshold falls within a certain range. In the power supply system 1, one of the larger number of produced fuse elements 20 is used. At common wire current values, the fuse element 20 melts and breaks before smoke is produced in the wire W.

The maximum values of the wire current values when normal operation is executed are indicated by dotted lines. As shown by the melting characteristics of the fuse element 20, even if the wire current value is greater than or equal to the melting threshold, the fuse element 20 does not melt immediately.

In the following, the maximum value of the wire current values when normal operation is executed is referred to simply as "maximum value of the wire current values". In the power distribution device 12, in a case where the switches A1, A2, and A3 are on, if the wire temperature calculated based on the wire current value is greater than or equal to the first temperature threshold, the switch A1 is turned off. Accordingly, the maximum value of the wire current values is reduced. Accordingly, the maximum value of the wire current values may exceed the melting threshold of the fuse element 20. Even in this case, since the switch A1 is turned off before the fuse element 20 melts and breaks, the fuse element 20 is not likely to melt accidentally.

Based on the description above, when a large number of fuse elements 20 are produced, the minimum value of the melting thresholds of the produced fuse elements 20 may also exceed the maximum value of the wire current values. In this case, since the maximum value of the melting thresholds is low, it is possible to use, as the wire W, a wire for which a permissible current having a small current value is specified, that is, a wire that has a low minimum value of the wire current values at which smoke is produced.

Also, if the wire temperature is reduced to a value less than the second temperature threshold after the switch A1 has been turned off, and then the wire temperature is increased to a value greater than or equal to the second temperature threshold, the switch A2 will be turned off. Furthermore, if, although the switch A1 has been turned off, the time period in which the wire temperature is greater than or equal to the second temperature threshold is greater than or equal to the time threshold, the switch A2 will be turned off. When the drive circuit D2 turns off the switch A2 in a state in which the switch A1 is off, the maximum value of the wire current values is further reduced. Therefore, there is a lower likelihood that the fuse element 20 will accidentally melt although normal operation is executed.

When the switches A1 and A2 are off, the maximum value of the wire current values is less than the minimum value of the melting thresholds. Accordingly, when the switches A1 and A2 are off, the fuse element 20 does not melt unless a failure occurs. Also, the average of the wire current values when normal operation is executed is less than the minimum value of the melting thresholds. Accordingly, there is a low likelihood that the switches A1 and A2 will be turned off.

A case is assumed in which at least one of the switches A1 and A2 is off. Even in this case, when a disable signal and an enable signal are input to the input unit 40 in this order, the control unit 47 controls, in the first control processing, the drive circuits D1, D2, and D3 to turn on the switches A1, A2, and A3.

Note that the precedent temperature difference needs only to be a temperature difference calculated in advance. Accordingly, the precedent temperature difference is not limited to the temperature difference calculated in the previous temperature calculation processing, but may be, for example, a temperature difference calculated in the temperature calculation processing before the previous one.

Embodiment 2

In Embodiment 1, the control unit 47 determines whether or not the switch A1 needs to be turned off based on the wire temperature. However, the value used to determine whether or not the switch A1 needs to be turned off is not limited to the wire temperature.

The following will describe Embodiment 2 focusing on differences from Embodiment 1. Configurations other than the below-described configurations are common to those of Embodiment 1. Accordingly, the same reference numerals as those in Embodiment 1 are given to the constituent components common to those of Embodiment 1, and descriptions thereof are omitted.

FIG. 10 is a diagram showing an information table 51 according to Embodiment 2. The information table 51 includes, as in Embodiment 1, a time threshold field, a first flag field, and a second flag field. In the time threshold field, the first flag field, and the second flag field, a time threshold, the value of a first flag, and the value of a second flag are stored. The time threshold is a constant value, and is stored in advance. The values of the first flag and the second flag are updated by the control unit 47. The values of the first flag and the second flag have the same meaning as those in Embodiment 1.

The information table 51 according to Embodiment 2 further include a first current threshold field and a second current threshold field. A first current threshold and a second current threshold for use in comparison with the wire current value are stored in the first current threshold field and the second current threshold field. The first current threshold and the second current threshold are each a constant value, and are stored in advance. The second current threshold is less than or equal to the first current threshold.

In Embodiment 2, the wire temperature does not need to be calculated, and thus the control unit 47 does not execute the temperature calculation processing. In the power distribution device 12 according to Embodiment 2, the temperature detection circuit 32, and the input unit 42 and the A/D converting unit 44 of the microcomputer 33 are not needed.

Figure 11:
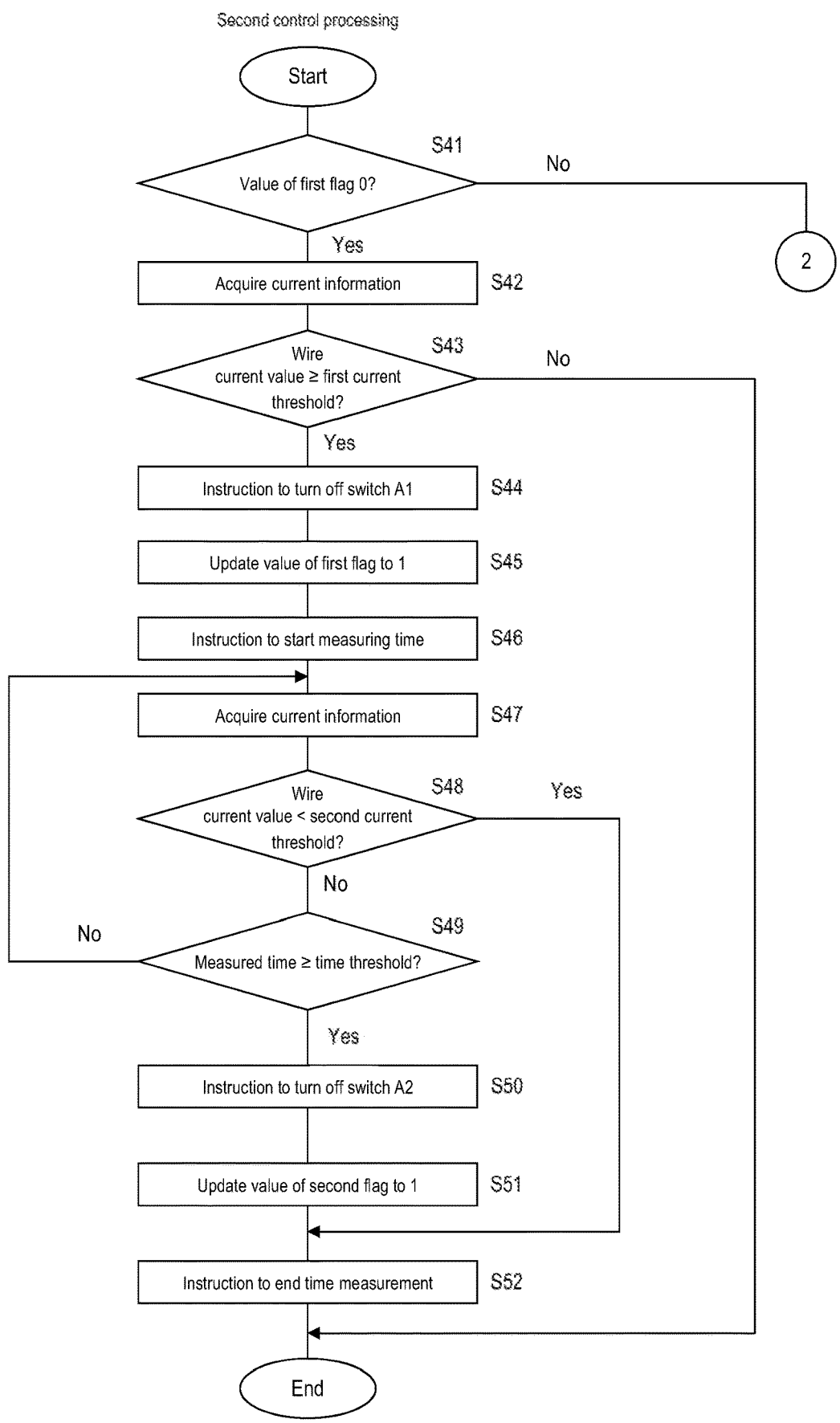
FIG. 11 is a flowchart illustrating a procedure of second control processing.
Figure 12:
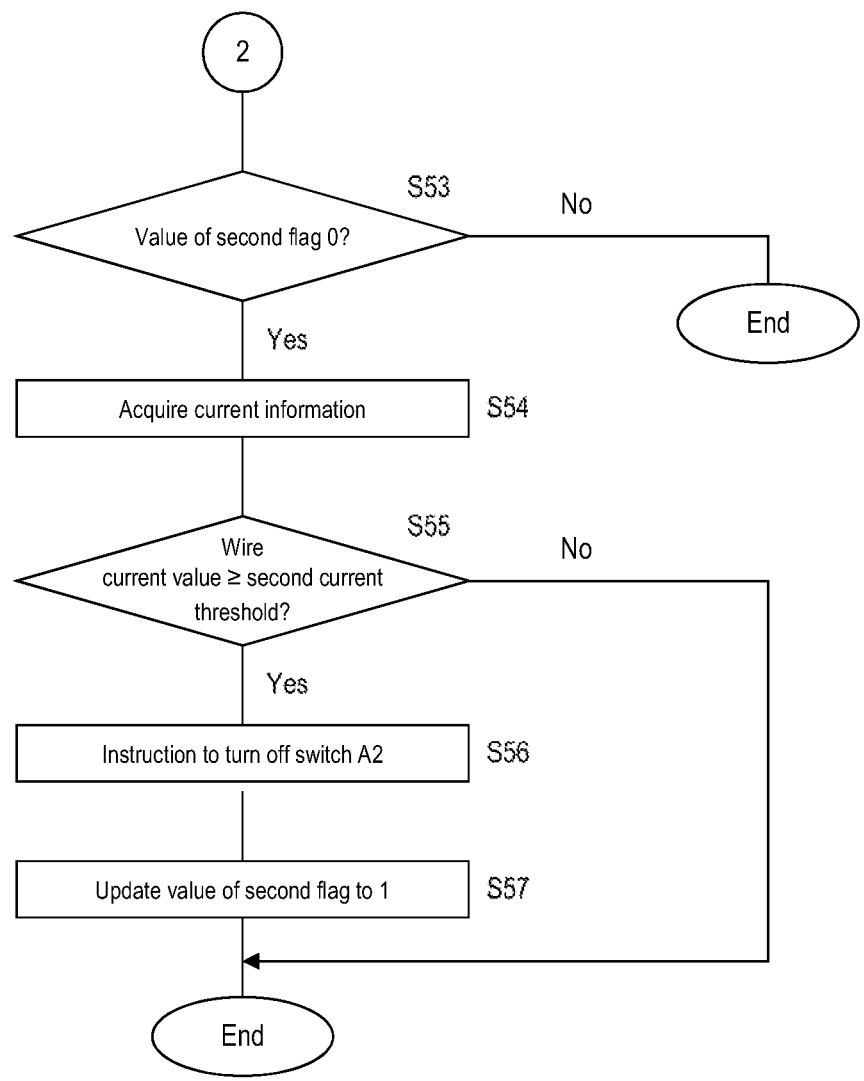
FIG. 12 is a flowchart illustrating the procedure of the second control processing.

FIGS. 11 and 12 are flowcharts showing a procedure of the second control processing. As in Embodiment 1, the control unit 47 periodically executes the second control processing during a time period from when an enable signal is input to the input unit 40 to when a disable signal is input to the input unit 40. Steps S41, S44 to S46, S50 to S53, S56, and S57 in the second control processing of Embodiment 2 are the same as steps S21, S23 to S25, S28 to S31, S33, and S34 in the second control processing of Embodiment 1. Accordingly, detailed descriptions of steps S41, S44 to S46, S50 to S53, S56, and S57 are omitted.

If it is determined that the value of the first flag is 0 (YES in step S41), the control unit 47 acquires current information from the A/D converting unit 43 (step S42), and determines whether or not the wire current value indicated by the acquired current information is greater than or equal to the first current threshold in the information table 51 (step S43). As described above, the control unit 47 periodically executes the second control processing during the time period from when an enable signal is input to the input unit 40 to when a disable signal is input to the input unit 40. Also, in the first control processing, when an enable signal is input to the input unit 40, the drive circuits D1, D2, and D3 respectively turn on the switches A1, A2, and A3, and the control unit 47 updates the values of the first flag and the second flag to 0. Furthermore, in a state in which the value of the first flag is 0, the value of the second flag is not updated to 1.

Accordingly, when, in step S41, the value of the first flag is 0, this means that the switches A1, A2, and A3 are on. Accordingly, steps S42 and S43 are executed in a state in which the switches A1, A2, and A3 are on. The wire current value indicated by the current information is the wire current value detected by the current detection circuit 31. In Embodiment 2, a predetermined condition is that the wire current value is greater than or equal to the first current threshold.

If it is determined that the wire current value is greater than or equal to the first current threshold (YES in S43), the control unit 47 executes steps S44 to S46 sequentially. After the execution of step S46, the control unit 47 acquires current information from the A/D converting unit 43 (step S47), and determines whether or not wire current value in the information table 51 that is indicated by the acquired current information is less than the second current threshold (step S48).

If it is determined that the wire current value is greater than or equal to the second current threshold (NO in step S48), the control unit 47 determines whether or not the measured time measured by the timer 45 is greater than or equal to the time threshold in the information table 51 (step S49). The determination of whether or not the measured time is greater than or equal to the time threshold in step S49 corresponds to the determination of whether or not the time period in which the wire current value is greater than or equal to the second temperature threshold after the drive circuit D1 has turned off the switch A1 is greater than or equal to the time threshold. When the measured time is greater than or equal to the time threshold, this means that the time period in which the wire current value in the information table 51 is greater than or equal to the second current threshold after the drive circuit D1 has turned off the switch A1 is greater than or equal to the time threshold. The control unit 47 also functions as a second time period determination unit.

If it is determined that the measured time is less than the time threshold (NO in step S49), the control unit 47 executes step S47, and stands by until the wire temperature is less than the second current threshold, or the measured time is greater than or equal to the time threshold. If it is determined that the measured time is greater than or equal to the time threshold (YES in step S49), the control unit 47 executes steps S50 and S51 sequentially. At the point in time when step S50 is executed, the switch A1 is off, and the switches A2 and A3 are on.

If it is determined that the wire current value is less than the second current threshold (YES in step S48), or after the execution of step S51, the control unit 47 executes step S52. If it is determined that the wire current value is less than the first current threshold (NO in step S43), or after the execution of step S52, the control unit 47 ends the second control processing.

If the time period in which the wire current value is greater than or equal to the second current threshold after the drive circuit D1 has turned off the switch A1 is greater than or equal to the time threshold, the drive circuit D2 turns off the switch A2, and the control unit 47 updates the value of the second flag to 1. In this case, the control unit 47 ends the second control processing in a state in which the values of the first flag and the second flag are 1. If the wire current value is reduced to a value less than the second current threshold before the time period in which the wire current value is greater than or equal to the second current threshold after the drive circuit D1 has turned off the switch A1 is greater than or equal to the time threshold, the control unit 47 will end the second control processing in a state in which the values of the first flag and the second flag are 1 and 0, respectively.

If it is determined in step S41 that the value of the first flag is not 0, that is, the value of the first flag is 1, the control unit 47 executes step S53, and determines whether or not the value of the second flag in the information table 51 is 0. When the values of the first flag and the second flag are respectively 1 and 0, this means that after the drive circuit D1 has turned off the switch A1, the wire current value is reduced to a value less than the second current threshold.

If it is determined that the value of the second flag is 0 (YES in step S53), the control unit 47 acquires current information from the A/D converting unit 43 (step S54), and determines whether or not the wire current value indicated by the acquired current information is greater than or equal to the second current threshold (step S55). As described above, the wire current value indicated by the current information is the wire current value detected by the current detection circuit 31. The control unit 47 also functions as a current determination unit.

If it is determined that the wire current value is greater than or equal to the second current threshold (YES in step S55), the control unit 47 executes steps S56 and S57 sequentially. If it is determined that the wire current value is less than the second current threshold (NO in step S55), or after the execution of step S57, the control unit 47 ends the second control processing.

As described above, in the power distribution device 12, if the wire current value is greater than or equal to the first current threshold, the drive circuit D1 turns off the switch A1. If the time period in which the wire current value is greater than or equal to the second current threshold after the drive circuit D1 has turned off the switch A1 is greater than or equal to the time threshold, the drive circuit D2 turns off the switch A2. The drive circuit D2 also turns off the switch A2 if the wire current value is reduced to a value less than the second current threshold, and then is increased to a value greater than or equal to the second current threshold. Accordingly, the maximum value of the wire current values when normal operation is executed in the power supply system 1 is reduced. The switch A3 is kept on until a disable signal is input to the input unit 40.

Accordingly, as in Embodiment 1, after the power supply to the loads L1 has been stopped, the power supply to the loads L2 is stopped. The power supply to the loads L3 is continued unless a disable signal is input. The importance of the loads L1, L2, and L3 is the same as those in Embodiment 1.

The power distribution device 12 in Embodiment 2 has the same effects as those of the power distribution device 12 in Embodiment 1. In the following, the maximum value of the wire current values when normal operation is executed is referred to simply as "maximum value of the wire current values".

Even if the wire current value is greater than or equal to the melting threshold, the fuse element 20 does not melt immediately. In the power distribution device 12, if the wire current value is greater than or equal to the first current threshold when the switches A1, A2, and A3 are on, the switch A1 will be turned off. Accordingly, the maximum value of the wire current values is reduced. Accordingly, the maximum value of the wire current values may exceed the melting threshold of the fuse element 20. Even in this case, since the switch A1 is turned off before the fuse element 20 melts and breaks, the fuse element 20 is not likely to melt accidentally.

Based on the description above, when a large number of fuse elements 20 are produced, the minimum value of the melting thresholds of the produced fuse elements 20 may also exceed the maximum value of the wire current values. In this case, since the maximum value of the melting thresholds is low, it is possible to use, as the wire W, a wire for which a permissible current having a small current value is specified, that is, a wire that has a low minimum value of the wire current values at which smoke is produced.

Also, if the wire current value is reduced to a value less than the second current threshold after the switch A1 has been turned off, and then the wire current value is increased to a value greater than or equal to the second current threshold, the switch A2 will be turned off. Furthermore, if, although the switch A1 has been turned off, the time period in which the wire current value is greater than or equal to the second current threshold is greater than or equal to the time threshold, the switch A2 will be turned off. When the drive circuit D2 turns off the switch A2 in a state in which the switch A1 is off, the maximum value of the wire current values is further reduced. Therefore, there is a lower likelihood that the fuse element 20 will accidentally melt although normal operation is executed.

When the switches A1 and A2 are off, the maximum value of the wire current values is less than the minimum value of the melting thresholds. Accordingly, when the switches A1 and A2 are off, the fuse element 20 does not melt unless a failure occurs. Also, the average of the wire current values when normal operation is executed is less than the minimum value of the melting thresholds. Accordingly, there is a low likelihood that the switches A1 and A2 will be turned off.

It should be noted that in Embodiments 1 and 2, the number of each set of the loads L1, L2, and L3 is not limited to 2, and may be 1 or three or more. Also, each of the switches A1, A2, and A3 is not limited to an N-channel type FET, and may be a P-channel type FET, a bipolar transistor, a relay contact, or the like.

Furthermore, the number of switches A1 connected between the wire W and the loads L1 is not limited to 1, and may be 2 or more. In this case, one or more loads L1 are connected to each switch A1. In Embodiment 1, the switch A1 is a switch that is turned off when the wire temperature is greater than or equal to the first temperature threshold. In Embodiment 2, the switch A1 is a switch that is turned off when the wire current value is greater than or equal to the first current threshold.

Also, the number of switches A2 connected between the wire W and the loads L2 is not limited to 1, and may be 2 or more. In this case, one or more loads L2 are connected to each switch A2. In Embodiment 1, the switch A2 is a switch that is turned off when the time period in which the wire temperature is greater than or equal to the second temperature threshold is greater than or equal to the time threshold, or when the wire temperature is reduced to a value less than the second temperature threshold, and then is increased to a value greater than or equal to the second temperature threshold. In Embodiment 2, the switch A2 is a switch that is turned off when the time period in which the wire current value is greater than or equal to the second current threshold is greater than or equal to the time threshold, or when the wire current value is reduced to a value less than the second current threshold, and then is increased to a value greater than the second current threshold.

Furthermore, the number of switches A3 connected between the wire W and the loads L3 is not limited to 1, and may be 2 or more. In this case, one or more loads L3 are connected to each switch A3. In Embodiments 1 and 2, the switch A3 is a switch that is kept on during the time period from when an enable signal is input to when a disable signal is input.

Also, in Embodiment 1, the power distribution device 12 may further include a switch, similar to the switch A2, that is turned off when a time period in which the wire temperature is greater than or equal to a third temperature threshold is greater than or equal to the time threshold, or when the wire temperature is reduced to a value less than the third temperature threshold, and then is increased to a value greater than or equal to the third temperature threshold. This switch is connected between the wire W and a load different from the loads L1, L2, and L3. The third temperature threshold is less than the second temperature threshold. Accordingly, it is possible to realize a configuration in which the maximum value of the wire current values when normal operation is executed can be reduced three times. In this way, by adding a switch whose temperature threshold for use in the determination is different from the temperature thresholds of the other switches, it is possible to increase the number of times the maximum value of the wire current values is reduced.

Moreover, in Embodiment 2, the power distribution device 12 may further include a switch, similar to the switch A2, that is turned off when a time period in which the wire current value is greater than or equal to a third current threshold is greater than or equal to the time threshold, or when the wire current value is reduced to a value less than the third current threshold, and then is increased to a value greater than the third current threshold. This switch is connected between the wire W and a load different from the loads L1, L2, and L3. The third current threshold is less than the second current threshold. Accordingly, it is possible to realize a configuration in which the maximum value of the wire current values when normal operation is executed can be reduced three times. In this way, by adding a switch whose current threshold for use in the determination is different from the current thresholds of the other switches, it is possible to increase the number of times the maximum value of the wire current values is reduced.

Also, in Embodiments 1 and 2, a configuration is also possible in which the power distribution device 12 includes only the switches A1 and A3. In this case, the number of times the maximum value of the wire current values is reduced is 1. In this configuration, when the switch A1 is turned off, the maximum value of the wire current values is less than the minimum value of the melting threshold of the fuse element 20. When the power distribution device 12 includes only the switches A1 and A3, N and K need only to satisfy N≥K+1.

It should be noted that Embodiments 1 and 2 have described examples in which all of the switches A1, A2, and A3 provided on three supply paths (the number N of which is 3) are controlled to be turned on and off according to the present aspect, but a configuration is also possible in which the switch provided on any of the plurality of supply paths is controlled to be turned on and off according to the present aspect, and the switches on the remaining supply paths are controlled to be turned on and off according to another method. Such power distribution device, power distribution method, and computer program are also included in the present disclosure.

It should be appreciated that Embodiments 1 and 2 disclosed herein are to be construed in all respects as illustrative and not limiting. The scope of the present disclosure is defined by the claims, rather than the description of the embodiment above, and is intended to include all modifications which fall within the scope of the claims and the meaning and scope of equivalents thereof.

The invention claimed is:

1. A power distribution device for distributing electric power supplied via a wire and a fuse element over a plurality of paths, the fuse element having a melting threshold that is less than the maximum value of a current flowing through the wire, the power distribution device comprising:
   a plurality of switches respectively provided on a plurality of supply paths;
   a current detection circuit configured to detect a current value of a current flowing through the wire;
   a temperature calculation unit configured to calculate a wire temperature of the wire based on the current value detected by the current detection circuit;
   a condition determination unit configured to determine, when the plurality of switches are on, whether or not the wire temperature calculated by the temperature calculation unit is greater than or equal to a first temperature threshold;
   a switching unit configured to turn off at least one of the plurality of switches if it is determined by the condition determination unit that the wire temperature is greater than or equal to the first temperature threshold; and
   a temperature determination unit configured to determine whether or not the wire temperature calculated by the temperature calculation unit is greater than or equal to a second temperature threshold, which is less than or equal to the first temperature threshold, after the at least one switch is turned off by the switching unit,
   wherein, if it is determined that the wire temperature is greater than or equal to the second temperature threshold for a predetermined time period or longer after the at least one switch is turned off by the switching unit, the switching unit is configured to turn off at least another one of the plurality of switches that are on even after the at least one switch is turned off.

2. A power distribution device for distributing electric power supplied via a wire and a fuse element over a plurality of paths, the fuse element having a melting threshold that is less than the maximum value of a current flowing through the wire, the power distribution device comprising:
   a plurality of switches respectively provided on a plurality of supply paths;
   a current detection circuit configured to detect a current value of a current flowing through the wire;
   a condition determination unit configured to determine, when the plurality of switches are on, whether or not the current value detected by the current detection circuit is greater than or equal to a first current threshold;
   a switching unit configured to turn off at least one of the plurality of switches if it is determined by the condition determination unit that the current value detected by the current detection circuit is greater than or equal to the first current threshold; and
   a current determination unit configured to determine whether or not the current value detected by the current detection circuit is greater than or equal to a second current threshold, which is less than or equal to the first current threshold, after the at least one switch is turned off by the switching unit, wherein, if it is determined that the current value is greater than or equal to the second current threshold for a predetermined time period or longer after the at least one switch is turned off by the switching unit, the switching unit is configured to turn off at least another one of the plurality of switches that are on even after the at least one switch is turned off.

3. A power distribution method comprising the steps of:

when a plurality of switches respectively provided on a plurality of supply paths that are used to distribute electric power supplied via a wire and a fuse element are on, the fuse element having a melting threshold that is less than the maximum value of a current flowing through the wire, calculating a wire temperature of the wire based on a current value of a current flowing through the wire;

determining whether or not the calculated wire temperature is greater than or equal to a first temperature threshold;

turning off at least one of the plurality of switches if it is determined that the wire temperature is greater than or equal to the first temperature threshold;

determining whether or not the calculated wire temperature is greater than or equal to a second temperature threshold, which is less than or equal to the first temperature threshold, after the at least one switch is turned off; and turning off at least another one of the plurality of switches that are on even after the at least one switch is turned off, if it is determined that the wire temperature is greater than or equal to the second temperature threshold for a predetermined time period or longer after the at least one switch is turned off.

* * * * *